United States Patent
Bass et al.

(10) Patent No.: US 8,703,386 B2
(45) Date of Patent: Apr. 22, 2014

(54) METAL PEROXO COMPOUNDS WITH ORGANIC CO-LIGANDS FOR ELECTRON BEAM, DEEP UV AND EXTREME UV PHOTORESIST APPLICATIONS

(75) Inventors: John David Bass, Union City, CA (US); Ho-Cheol Kim, San Jose, CA (US); Robert Dennis Miller, San Jose, CA (US); Qing Song, San Jose, CA (US); Linda Karin Sundberg, Los Gatos, CA (US); Gregory Michael Wallraff, San Jose, CA (US)

(73) Assignee: International Business Machines Corporation, Armonk, NY (US)

(*) Notice: Subject to any disclaimer, the term of this patent is extended or adjusted under 35 U.S.C. 154(b) by 54 days.

(21) Appl. No.: 13/405,587

(22) Filed: Feb. 27, 2012

(65) Prior Publication Data
US 2013/0224652 A1    Aug. 29, 2013

(51) Int. Cl.
G03F 7/00 (2006.01)
G03F 7/004 (2006.01)
G03F 7/029 (2006.01)
C07C 49/92 (2006.01)
C07C 7/00 (2006.01)

(52) U.S. Cl.
USPC ............... 430/270.1; 556/40; 556/42; 556/55

(58) Field of Classification Search
USPC .............................. 430/270.1; 556/40, 42, 55
See application file for complete search history.

(56) References Cited

U.S. PATENT DOCUMENTS 5,061,599 A * 10/1991 Kudo et al. ................ 430/270.1
5,178,989 A * 1/1993 Heller et al. .................. 430/323

6,965,045 B2    11/2005  Jung et al.
7,077,895 B2     7/2006  Akui et al.
7,312,013 B2    12/2007  Takahashi et al.
2011/0045406 A1  2/2011  Keszler et al.

FOREIGN PATENT DOCUMENTS

JP           61273539         12/1986

OTHER PUBLICATIONS

Bayot et al, "Vibrational Spectra of Eoght-Coordinate Niobium and Tantalum Complexes with Peroxo Ligands:A Theorretcial Simulation", J. Inorganic Chem (2005), 4118-4123.*
Bayot et al, "Peroxo complexes of niobium (V) and tantalum (V)", Coordination Chemistry Reviews 250 (2006), 2610-2626.*
Djordjevic et al, "Coordination Complexes of Niobium and Tantalum. Eight-coordinated Di- and Triperoxoniobates (V) and tantalates (V) with Some Nitrogen and Oxygen Bidentate Ligands", Inorganic Chemistry, vol. 7, No. 9 (1968), 1864-1868.*
Anderson, et al., "The SEMATECH Berkeley MET: extending EUV learning down to 16nm half pitch", Proc. SPIE 7969, 79690R (2011), Feb. 28, 2011.

(Continued)

Primary Examiner — Amanda C. Walke
(74) Attorney, Agent, or Firm — Michael R. Roberts

(57) ABSTRACT

Compositions are disclosed having the formula (3):

$$[C']_k[Ta(O_2)_x(L')_y] \qquad (3),$$

wherein x is an integer of 1 to 4, y is an integer of 1 to 4, $Ta(O_2)_x(L')_y$ has a charge of 0 to $-3$, C' is a counterion having a charge of $+1$ to $+3$, k is an integer of 0 to 3, L' is an oxidatively stable organic ligand having a charge of 0 to $-4$, and L' comprises an electron donating functional group selected from the group consisting of carboxylates, alkoxides, amines, amine oxides, phosphines, phosphine oxides, arsine oxides, and combinations thereof. The compositions have utility as high resolution photoresists.

14 Claims, 15 Drawing Sheets

(56) References Cited

OTHER PUBLICATIONS

Henke, et al., "X-Ray Interactions: Photoabsorption, Scattering, Transmission, and Reflection at E = 50-30,000 eV, Z = 1-92," Atomic Data and Nuclear Data Tables vol. 54, 211-336 (1993).

Larson, et al., "Combinatorial Resist Processing Studies," Proc. SPIE 5376, 1165-1163 (2004), Feb. 23, 2004.

Okamoto, et al., "Peroxopolytungstic acids: A new inorganic resist material", Appl. Phys, Lett. 49 (5), 298-300, Aug. 4, 1986.

Petrykin, et al., "Synthesis and Structure of New Water-Soluble and Stable Tantalum Compound: Ammonium Tetralactatodiperoxo-i-oxo-ditantalate(V)", Inorganic Chemistry, vol. 45, No. 23, 9251-9256, 2006, Published on Web Oct. 21, 2006.

Stowers, et al., "Directly patterned inorganic hardmask for EUV lithography", Proc. SPIE 2011, 7969, 796915, Apr. 6, 2011.

* cited by examiner

1) Optional PAB
2) Expose

1) Optional PEB
2) Develop

1) Image Transfer
2) Resist Removal

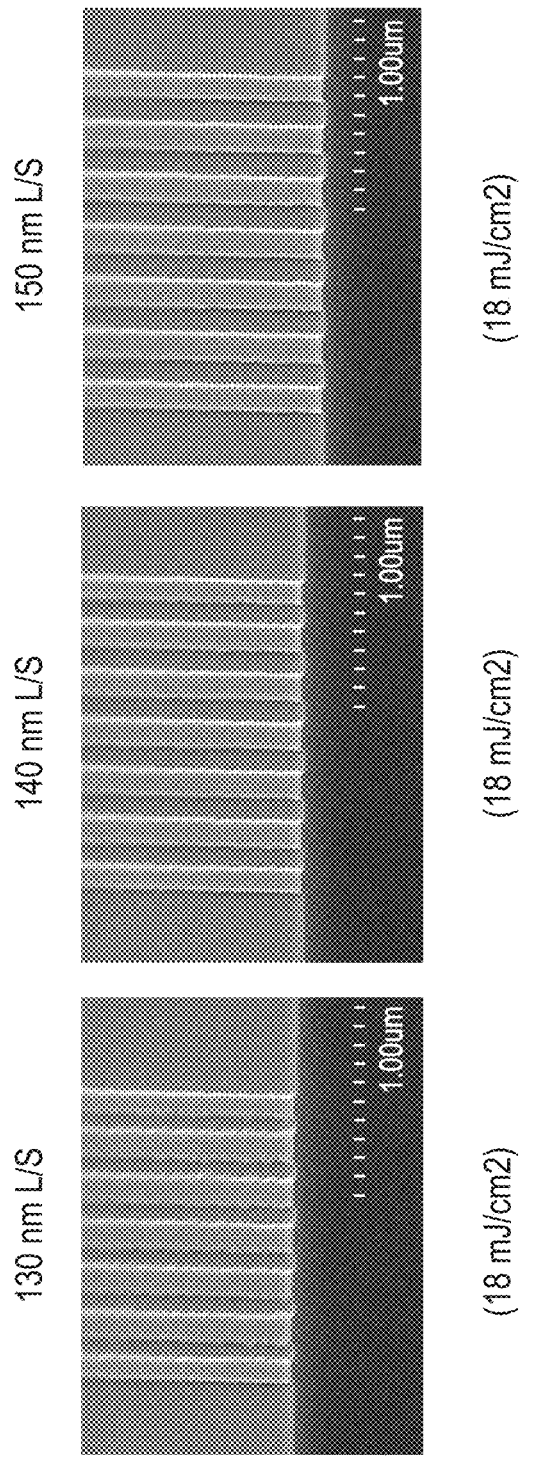
FIG. 9A  130 nm L/S (18 mJ/cm2)
FIG. 9B  140 nm L/S (18 mJ/cm2)
FIG. 9C  150 nm L/S (18 mJ/cm2)

US 8,703,386 B2

METAL PEROXO COMPOUNDS WITH ORGANIC CO-LIGANDS FOR ELECTRON BEAM, DEEP UV AND EXTREME UV PHOTORESIST APPLICATIONS

BACKGROUND

The present invention relates generally to the field of lithographic patterning methods and semiconductor fabrication. More specifically this invention relates to the use of inorganic materials ligated with peroxo and organic functional groups in lithographic photoresist processes. This invention also relates to the lithographic patterning of metal oxides.

Implementation of extreme ultraviolet (EUV) lithography necessitates the development of compatible photoresists that can perform at spatial resolutions below 16 nm. Currently, traditional chemically amplified (CA) photoresists are struggling to meet the specifications for resolution, photospeed and feature roughness (termed line edge roughness, or LER) for next generation devices (Anderson, C. N.; Baclea-An, L.-M.; Denham, P.; George, S.; Goldberg, K. A.; Jones, M. S.; Smith, S. S.; Wallow, T. I.; Montgomery, M. W.; Naulleau, P., Proc. SPIE 7969, 79690R (2011)). The intrinsic image blur due to the acid catalyzed reactions that occur in these polymeric photoresists limits the resolution at small feature sizes, a fact that has been known for many years from electron-beam (e-beam) lithography. While CA photoresists are designed for high sensitivity they can suffer under EUV exposure in part because their typical elemental makeup (mainly C, with smaller quantities of O, F, S) make the photoresists too transparent at a wavelength of 13.5 nm, consequently reducing sensitivity. CA photoresists also suffer from roughness issues at small feature sizes, and experiments have indicated that the LER increases as the photospeed decreases, due in part to the nature of acid catalyzed processes. Due to the failings and problems of CA photoresists there is a need in the semiconductor industry for new types of high performance photoresists. Inorganic photoresists are one such candidate.

Previously, inorganic photoresists based on peroxopolyacids of tungsten and tungsten mixed with niobium, titanium, and/or tantalum have been reported for use as radiation sensitive materials for patterning (Kudo et. al., U.S. Pat. No. 5,061,599, 1991; H. Okamoto, T. Iwayanagi, K. Mochiji, H. Umezaki, T. Kudo, Applied Physics Letters, 49 (5), 298-300, 1986). These materials were effective in patterning large features in a bilayer configuration with deep UV, x-ray, and e-beam sources. More recently, impressive performance was shown using a cationic hafnium metal oxide sulfate (HfSOx) material with a peroxo complexing agent to image 15-nm half-pitch (HP) by projection EUV exposure (Keszler et al., US20110045406, 2011 and J. K. Stowers, A. Telecky, M. Kocsis, B. L. Clark, D. A. Keszler, A. Grenville, C. N. Anderson, P. P. Naulleau, Proc. SPIE, 7969, 796915, 2011). This system demonstrated the best performance of a non-CA photoresist and has a photospeed approaching the requirements for a viable EUV photoresist.

The hafnium metal oxide sulfate materials with a peroxo complexing agent have several practical drawbacks. First, the materials are cast out of highly corrosive sulfuric acid/hydrogen peroxide mixtures and they show significant issues with shelf-life stability. Second, these are poorly characterized, complex mixtures with no clear pathway to modify their structure to improve performance. Third, they must be developed in extremely high concentration tetramethylammonium hydroxide (TMAH) solutions of up to 25 weight percent (wt %). This represents a significant toxicological concern. Finally, though still under development, it is not clear that either of these classes of materials will ever be able to fully satisfy the performance requirements for EUV in such areas as sensitivity and line edge roughness.

Thus, inorganic compounds are needed having more favorable properties for EUV lithography, including but not limited to solubility in a suitable casting solvent, solubility in a suitable developer, high sensitivity to EUV, and compatibility with thermal treatments following film formation and/or exposure.

SUMMARY

Accordingly, a composition of matter is disclosed of formula (3):

$$[C']_k[Ta(O_2)_x(L')_y] \qquad (3),$$

wherein
x is an integer of 1 to 4,
y is an integer of 1 to 4,
$Ta(O_2)_x(L')_y$ has a charge of 0 to −3,
C' is a counterion having a charge of +1 to +3,
k is an integer of 0 to 3,
L' is an oxidatively stable organic ligand having a charge of 0 to −4, and
L' comprises an electron donating functional group selected from the group consisting of carboxylates, alkoxides, amines, amine oxides, phosphines, phosphine oxides, arsine oxides, and combinations thereof.

Also disclosed is a photoresist composition comprising the above-described composition, wherein the photoresist composition is suitable for e-beam lithography, x-ray lithography, and/or lithography utilizing an ultraviolet radiation source having a wavelength that is between 10 nm and 400 nm.

Also disclosed is a photoresist composition, comprising:
a solvent; and
a peroxo complex having a structure according to formula (1):

$$[C']_k[M'_w(O_2)_x(L')_yO_u] \qquad (1),$$

wherein
w is 1 or 2,
x is an integer of 1 to 4,
y is an integer of 1 to 4,
u is 0 or 1,
$M'_w(O_2)_x(L')_yO_u$ has a charge of 0 to −3,
C' is an optional counterion having a charge of +1 to +3,
k is an integer of 0 to 3,
M' is an ion of a metal selected from the group consisting of Ta, Nb, V, Mo, Co, Zn, Sb, Fe, W, Zr, Hf, Sn, Pb, Cr, Re, Ti, and combinations thereof,
M' has an oxidation state of +1 to +6,
L' is an oxidatively stable organic ligand having a charge of 0 to −4, and
L' comprises an electron donating functional group selected from the group consisting of carboxylates, alkoxides, amines, amine oxides, phosphines, phosphine oxides, arsine oxides, and combinations thereof.

A method is disclosed, comprising:
i) providing a photoresist composition comprising:
a solvent; and
a peroxo complex having a structure according to formula (1):

$$[C']_k[M'_w(O_2)_x(L')_yO_u] \qquad (1),$$

wherein
w is 1 or 2,
x is an integer of 1 to 4, y is an integer of 1 to 4,
u is 0 or 1,
M'$_w$(O$_2$)$_x$(L')$_y$O$_u$ has a charge of 0 to −3,
C' is an optional counterion having a charge of +1 to +3,
k is an integer of 0 to 3,
M' is an ion of a metal selected from the group consisting of Ta, Nb, V, Mo, Co, Zn, Sb, Fe, W, Zr, Hf, Sn, Pb, Cr, Re, Ti, and combinations thereof,
M' has an oxidation state of +1 to +6,
L' is an oxidatively stable organic ligand having a charge of 0 to −4, and
L' comprises an electron donating functional group selected from the group consisting of carboxylates, alkoxides, amines, amine oxides, phosphines, phosphine oxides, arsine oxides, and combinations thereof;

ii) disposing the photoresist composition on a surface of a substrate and removing the solvent, thereby forming a photoresist layer disposed on the substrate;

iii) exposing imagewise the photoresist layer to radiation selected from the group consisting of e-beam, x-ray, and ultraviolet (UV) radiation; and iv) developing the exposed photoresist layer in an aqueous and/or organic developer, thereby forming a layered structure comprising a patterned photoresist layer disposed on the substrate, the patterned photoresist layer comprising topographical features comprising exposed photoresist.

Also disclosed is a photoresist composition, comprising:
a metal salt comprising a metal ion selected from the group consisting of titanium (IV), Niobium (V) and Tantalum (V);
an organic carboxylic acid in an amount of 0.5 to 3.0 molar equivalents relative to moles of the metal ion;
hydrogen peroxide in an amount of 1.0 to 10.0 molar equivalents relative to moles of the metal ion; and
a solvent.

The above-described and other features and advantages of the present invention will be appreciated and understood by those skilled in the art from the following detailed description, drawings, and appended claims.

BRIEF DESCRIPTION OF THE SEVERAL VIEWS OF THE DRAWINGS

FIGS. 9A to 9C are SEM images of 130 nm line space (L/S) patterns (i.e., L/S means the lines and spaces have equal width), 140 nm L/S, and 150 nm L/S, respectively, obtained with the photoresist composition of Example 2 using 193 nm (18 mJ/cm$^2$) lithography and the following process conditions, PAB 300 sec at 150° C., PEB 60 sec at 150° C., and 60 sec development in 0.26 N TMAH.

DETAILED DESCRIPTION

Figure 1A:
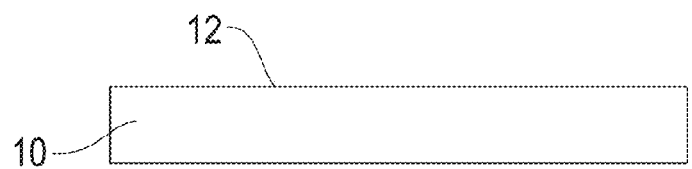
FIGS. 1A to 1E are schematic layer diagrams showing a method of forming a multi-layered structure that includes a topographical patterned layer comprising exposed photoresist composition. The photoresist composition was prepared using the disclosed peroxo complex.

The invention is based on the discovery that metal peroxo complexes comprising organic co-ligands have favorable properties for lithographic processes. A photoresist composition comprising a peroxo complex can be cast as a high quality film from aqueous solution to form a thin uniform photoresist layer. Imagewise exposure of the photoresist layer can be performed using e-beam, x-ray, and/or ultraviolet radiation having a wavelength in a range of 400 nm to 10 nm, 200 nm to 20 nm, preferably 121 nm to 5 nm (extreme ultraviolet (EUV) wavelengths). In an embodiment, the exposure is performed using an EUV wavelength of 13.5 nm. The exposed regions of the photoresist layer become less soluble in a developer compared to non-exposed regions (i.e., the photoresist layer is negative-working). Development of the exposed photoresist layer can be performed using standard aqueous base developer (e.g., 0.26 N tetramethylammonium hydroxide (TMAH) solution) or simply water. The resulting relief pattern comprises features composed of exposed photoresist. The relief image can be transferred to the underlying substrate by known techniques.

The metal peroxo complexes contain elements such as Ta that are more absorbent to EUV than carbon and silicon based polymers (B. L. Henke, E. M. Gullikson, and J. C. Davis. Atomic Data and Nuclear Data Tables Vol. 54, 181-342 (1993)). The organic co-ligand(s) allow the tuning of performance properties (e.g., sensitivity and resolution) and processing properties (e.g., stability, film forming behavior, deposition and development conditions). For example, $[NH_4]_3[Ta(O_2)_4]$ is difficult to cast from solution as a thin film due to its tendency to crystallize. The addition of one equivalent of oxalic acid as a co-ligand produces a material able to be cast from aqueous solution.

The peroxo complex includes a metal ion M' having a valency of 1 to 6, a peroxo ligand ($O_2^{-2}$, written herein as $O_2$ in the formulas that follow) having a valency of 2, an optional oxido ligand ($O^{-2}$, written herein as O in the formulas that follow) having a valency of 2, and at least one organic ligand L' having a charge of 0 to −4 and a valency of 0 to 6.

In an embodiment, the peroxo complex has a structure in accordance with formula (1):

(1), wherein
w is 1 or 2,
x is an integer of 1 to 4,
y is an integer of 1 to 4,
u is 0 or 1,
$[M'_w(O_2)_x(L')_yO_u]$ has a charge of 0 to −3,
C' is an optional counterion having a charge of +1 to +3,
k is an integer of 0 to 3,
M' is an ion of a metal selected from the group consisting of Ta, Nb, V, Mo, Co, Zn, Sb, Fe, W, Zr, Hf, Sn, Pb, Cr, Re, Ti, and combinations thereof,
M' has an oxidation state of +1 to +6,
L' is an oxidatively stable organic ligand having a charge of 0 to −4, and
L' comprises an electron donating functional group selected from the group consisting of carboxylates, alkoxides, amines, amine oxides, phosphines, phosphine oxides, arsine oxides, and combinations thereof. Herein, carboxylates comprise a $RCO_2^-$ functional group and alkoxides comprise a $RO^-$ functional group, wherein R comprises at least one carbon. Amines include primary, secondary, and/or tertiary amines.

Non-limiting examples of organic ligands that comprise carboxylate ions and/or alkoxide ions include deprotonated forms of lactic acid, glycolic acid, citric acid, malonic, malic acid, tartaric acid, pyridine-2-carboxylic acid, pyrazine-2-carboxylic acid, pyridine-2,6-dicarboxylic acid, iminodiacetic acid, ethylenediaminetetraacetic acid, nitrilotriacetic acid, quinolinol, and combinations thereof.

Non-limiting examples of organic ligands comprising amines include the above-mentioned amines, aniline, pyridine, bipyridine, ethylenediamine, aminopyridine, o-phenanthroline), and combinations thereof.

Non-limiting examples of organic ligands comprising amine oxides include pyridine n-oxide, picoline n-oxide, and combinations thereof.

A non-limiting example of a phosphine organic ligand is triphenylphosphine.

A non-limiting example of a phosphine oxide organic ligand is triphenylphosphine oxide.

A non-limiting example of an arsine oxide organic ligand is triphenylarsine oxide.

The crystal forms of the peroxo complexes can optionally further include 1 to 10 water molecules of hydration.

Non-limiting peroxo complexes of formula (1) include $[NH_4]_4[Ta_2(O_2)_2(C_3H_4O_3)_4O]$, $[NH_4]_4[Ta_2(O_2)_2(C_2H_2O_3)_4O]$, and $[NH_4]_4[Nb_2(O_2)_2(C_3H_4O_3)_4O]$. The peroxo complexes can be used in combination. The charges on the different ligands and counterion are not shown.

More specific peroxo complexes comprise one metal center and have the formula (2):

(2), wherein
x is an integer of 1 to 4,
y is an integer of 1 to 4,
$[M'_w(O_2)_x(L')_y]$ has a charge of 0 to −3,
C' is an optional counterion having a charge of +1 to +3,
k is an integer of 0 to 3,
M' is an ion of a metal selected from the group of metals consisting of Ta, Nb, V, Mo, Co, Zn, Sb, Fe, W, Zr, Hf, Sn, Pb, Cr, Re, Ti, and combinations thereof,
M' has an oxidation state of +1 to +6,
L' is an oxidatively stable organic ligand having a charge of 0 to −4, and
L' comprises an electron donating functional group selected from the group consisting of carboxylates, alkoxides, amines, amine oxides, phosphines, phosphine oxides, arsine oxides, and combinations thereof.

In one embodiment, M' in formula (2) is tantalum (V) (tantalum in the +5 oxidation state), C' is ammonium ($NH_4^+$, also written in the formulas as $NH_4$ without the charge), and L' is selected from the group consisting of oxalate ($C_2O_4^{-2}$, both acid groups are deprotonated, also written as $C_2O_4$ in the formulas), malonate ($C_3H_2O_4^{-2}$, both acid groups are deprotonated, also written as $C_3H_2O_4$ in the formulas), malate ($C_4H_3O_5^{-3}$, both acid groups and the hydroxy group are deprotonated, also written as $C_4H_3O_5$ in the formulas), lactate ($C_3H_4O_3^{-2}$, both acid groups are deprotonated, also written as $C_3H_4O_3$ in the formulas), glycolate ($C_2H_2O_3^{-2}$, the acid group and hydroxy group are deprotonated, also written as $C_2H_2O_3$ in the formulas), and combinations thereof.

Even more specific peroxo complexes have the formula (3):

(3), wherein
x is an integer of 1 to 4,
y is an integer of 1 to 4,
$[Ta(O_2)_x(L')_y]$ has a charge of 0 to −3,
C' is a counterion having a charge of +1 to +3,
k is an integer of 0 to 3,
L' is an oxidatively stable organic ligand having a charge of 0 to −4, and
L' comprises an electron donating functional group selected from the group consisting of carboxylates, alkoxides, amines, amine oxides, phosphines, phosphine oxides, arsine oxides, and combinations thereof. In an embodiment, x is 3, y is 1, and k is 3. In another embodiment L' comprises a functional group selected from the group consisting of carboxylates and/or alkoxides. In another embodiment, L' is a dianion selected from the group consisting of oxalate ($C_2O_4^{-2}$), lactate, ($C_3H_4O_3^{-2}$), glycolate ($C_2H_2O_3^{-2}$), and combinations thereof. In another embodiment, C' is ammonium ($NH_4^+$).

Non-limiting examples of peroxo complexes of formula (2) and/or formula (3) include $[NH_4]_3[Ta(O_2)_3(C_2O_4)]$ and $[Ti(O_2)_2(C_2O_4)]$. The peroxo complexes can be used in combination. The charges on the different ligands and counterion are not shown.

Figure 1B:
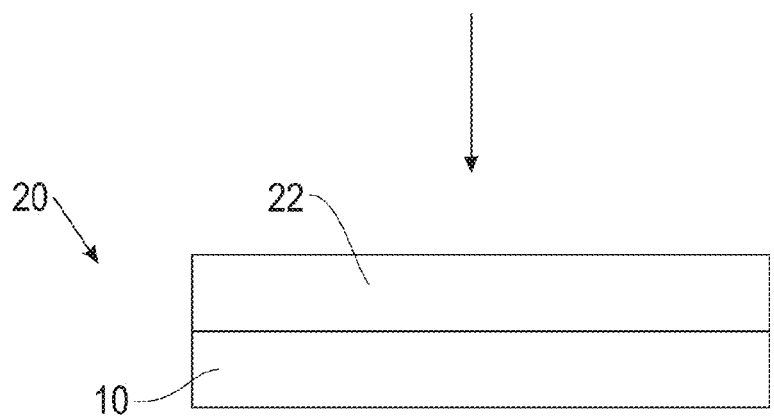
Figure 1C:
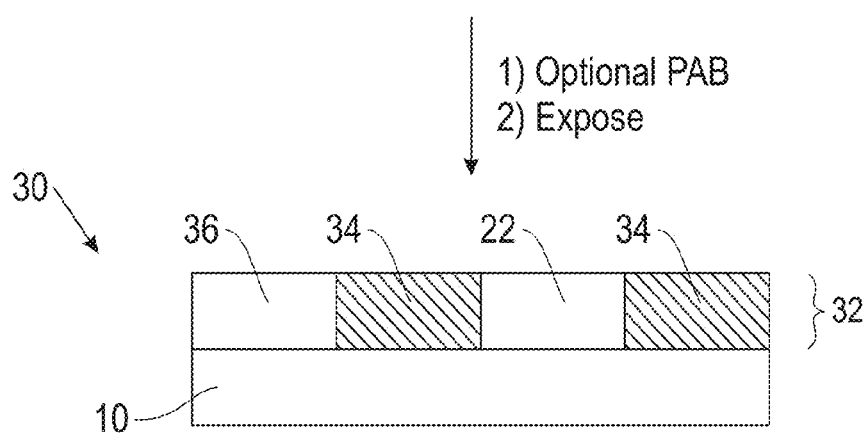
Figure 1D:
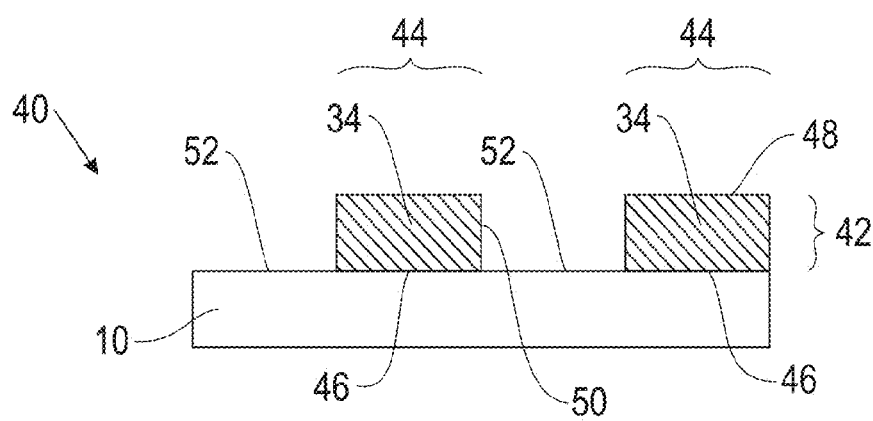
Figure 1E:
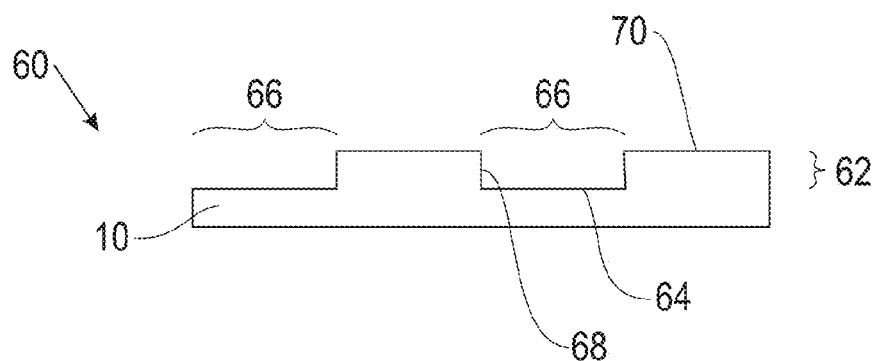

The schematic layer diagrams of FIGS. 1A to 1E illustrate a method of forming a lithographically patterned layered structure utilizing a photoresist composition comprising at least a peroxo complex and a solvent. The photoresist composition is disposed on surface 12 of substrate 10 (FIG. 1A) followed by removal of the solvent to form photoresist layer 22 of structure 20 (FIG. 1B). Photoresist layer 22 can be treated with an optional post-application bake (PAB) and/or an optional solvent rinse under suitable conditions of time and temperature before exposure. Pattern-wise exposure of photoresist layer 22 is performed preferably using EUV and/or e-beam, resulting in exposed photoresist layer 32 of structure 30 (FIG. 1C). Photoresist layer 32 is composed of regions of exposed photoresist 34 and regions of non-exposed photoresist 36. Photoresist layer 32 can be treated with an optional post-exposure bake (PEB) and/or an optional solvent rinse under suitable conditions of time and temperature before development. The exposed photoresist 34 has less solubility in a developer compared to non-exposed photoresist 36. Consequently, aqueous development affords a negative-tone image by removing regions of non-exposed photoresist 36. The PAB, PEB and/or solvent rinse(s) can enhance solubility differences of the exposed and non-exposed photoresist in a given developer. Development in a developer produces layered structure 40 comprising patterned photoresist layer 42 (FIG. 1D). Patterned photoresist layer 42 is a topographical relief pattern comprising photoresist features 44 composed of exposed photoresist 34. Photoresist features 44 are disposed on surface 46 of substrate 10 and have top surface 48 and sidewall 50. Substrate surface 52 is in contact with air. The topographical relief pattern of patterned photoresist layer 42 can be transferred to substrate 10 by known methods (e.g., oxygen ion etching) followed by removal of photoresist features 44, resulting in structure 60 (FIG. 1E). Structure 60 comprises a transferred topographical pattern 62 within substrate 10, whose features 66 comprise bottom surface 64, sidewall surface 68, and top surface 70 of substrate 10.

The photoresist layer can be rinsed before or after the exposure, the PAB, and/or the PEB with a solvent (e.g., water, aqueous solutions, including water/alcohol mixtures, and organic solvents) to remove excess ligand or to promote partial condensation. Typically, the rinse is performed after the PAB. Rinses can be performed at or near room temperature (e.g., 10° C. to 50° C.) for a period of 1 second to 1 hour.

Optionally, the pre-developed photoresist layer and/or post-developed photoresist layer can be treated with water vapor and/or alcohol vapor either at room temperature or at elevated temperature on a time scale of 1 minute to 5 hours. Such a treatment after exposure and PEB can be conducted, for example, to promote additional crosslinking or to modify the functional group distribution of the metal oxide matrix.

The term "substrate" refers to all underlying layers of a structure on which the photoresist layer is disposed. The substrate can have one or more layers arranged in a stack. In a multi-layered substrate, the layer directly below and in contact with the photoresist layer is the top-most layer of the substrate, also referred to as "the underlayer" to the photoresist layer. The terms "surface" or "underlying surface" refer, unless otherwise stated, to the substrate surface on which the photoresist layer is disposed. As non-limiting examples, the photoresist layer can be disposed on the surface of a silicon wafer or a metal foil, or more particularly on the surface of an anti-reflection layer (ARC) of a multi-layer substrate, where the ARC layer is the top-most layer. In this example, the ARC layer is also the underlayer of the photoresist layer. In another example, the ARC layer has a polymer brush layer attached to the top surface. In this example, the polymer brush layer is also the underlayer of the photoresist layer.

The term "disposed" refers to a layer in contact with a surface of another layer. "Disposing" and "applying" refer to forming a layer to be in contact with a surface of another layer, without limitation as to the method employed unless otherwise stated, providing the desirable properties of the disposed or applied layer are not adversely affected (e.g., uniformity and thickness).

The term "casting" refers to forming a layer of a material by disposing a solution of the material dissolved in a solvent on a surface of another layer, and removing the solvent.

Herein, a "positive-working" photoresist is a photoresist that becomes more soluble in a given developer when exposed to a radiation, typically by a non-crosslinking chemical reaction induced by the exposure.

A "negative-working" photoresist becomes less soluble in a given developer when exposed to a radiation, typically due to a crosslinking reaction or some other chemical change induced by the exposure, which lowers the solubility of the photoresist in the developer. The photoresist compositions herein are negative-working.

"Negative-tone development" means the non-exposed areas of the photoresist layer are removed during development. "Positive-tone development" means the exposed areas of the photoresist layer are removed during development.

It is understood that in some cases (e.g., when forming dense, high resolution patterns) all of the photoresist layer can receive some dose of radiation exposure. "Non-exposed photoresist" refers to photoresist that has received insufficient dose to switch the solubility of the photoresist in a given developer compared to the pre-exposed photoresist, including pre-exposed photoresist that has been treated with an optional bake and/or optional rinse. "Exposed photoresist" has received sufficient exposure to switch the solubility of the photoresist in a given developer compared to the pre-exposed photoresist.

When referring to the chemical components, reactivity, solubility and/or surface properties of the photoresist layer, it is understood that such reference is directed only to the photoresist layer and not to the substrate or the substrate surface, unless otherwise stated. Likewise, when referring to the chemical components, chemical reactivity, solubility and/or surface properties of the substrate surface or substrate layers, such reference is directed only to the substrate surface or substrate layer(s) and not to the photoresist layer, unless otherwise stated.

Without being bound by theory, the photoresist compositions herein are believed to operate by a crosslinking and/or a polarity switching mechanism as a result of chemical changes in the film cast from the peroxo complex induced by the exposure. The optional baking (PAB and/or PEB) treatments and/or optional rinsing treatments can enhance the solubility difference of the exposed photoresist compared to the non-exposed photoresist. Decreased solubility of the exposed photoresist can result from a morphological change in structure (e.g., a crystalline to amorphous phase transition of the peroxo complex, or vice versa) and/or a change in the chemical structure of the peroxo complex (e.g., chemical crosslinking and/or loss of organic ligand from the peroxo complex). A PAB and/or PEB can be used to facilitate cross-linking chemistry and/or elimination of reaction byproducts of the photoresist composition.

"Polarity change" implies an altered chemical composition that affects relative solubility without crosslinking. The extent of the polarity change can be measured by comparing the solubility of the exposed photoresist and non-exposed photoresist in a given developer. "Inducing a polarity change" in the photoresist layer means subjecting the photoresist layer to a treatment involving exposure, a post-exposure bake (PEB) and/or an optional rinse that alters the chemical composition of the layer such that the treated photoresist has a different solubility in a given developer compared to the pre-treated photoresist.

The optional post-application bake (PAB) treatment is typically performed at a temperature of 50° C. to 250° C. for a period of 1 second to 1 hour, preferably 1 second to 10 minutes. The PAB can be used to dry the film of excess solvent, remove unwanted or excess organic ligand, and/or partially crosslink the photoresist layer. The thermally treated dry film typically will have a thickness of 0.01 micrometers to 10 micrometers, depending on the subsequent radiation source and the desired application.

The optional post-exposure bake (PEB) can be performed at a temperature of 50° C. to 300° C. for 1 second to 1 hour, preferably 1 second to 10 minutes.

The patterned photoresist layer can also be given a post-development treatment, for example, to condense the peroxo complex into an amorphous metal oxide and/or induce crystallization, thereby increasing etch resistance. The post-development treatment can be photochemical, thermal, chemical, or a combination thereof. As an example, the patterned photoresist layer can be given a second exposure to a second radiation, thereby forming a treated patterned photoresist layer. The second exposure can be performed with a single wavelength of second radiation or a combination of suitable wavelengths (broad band) of second radiation, so long as the exposure is effective in inducing the desired response of the treated patterned photoresist layer. The second exposure treatment can be a flood exposure. The flood exposure can be a single conventional whole area exposure or a combination of conventional whole area exposures. The exposure treatment can also be a scanning exposure delivered by a digital writing device employing light emitting sources. The second exposure can be followed by a thermal treatment to chemically amplify the formation of chemical functional groups in the treated patterned photoresist layer. For example, the flood exposure can release an acid from previously unreacted photoacid generator (PAG) that upon subsequent heating catalyzes the deprotection of additional acid-sensitive carboxylic acid esters, aromatic acetals/ketals, and/or carbonates, thereby increasing the concentration of carboxylic acid and phenol groups in the treated patterned photoresist layer. With sufficient polarity change, the treated patterned photoresist layer can be rendered insoluble in either a low polarity solvent (e.g., anisole) or a more polar organic solvent, while retaining solubility in aqueous alkaline developer and/or a second organic solvent, without crosslinking the photoresist.

A post-development thermal treatment can further tailor the solvent compatibility, chemical structure of the photoresist material, and/or etch resistance of the patterned photoresist layer. The thermal treatment can be conducted at a temperature of 50° C. to 600° C., 50° C. to 300° C., or 50° C. to 200° C. for a period of 1 sec to 1 day. For example, when preparing patterned metal oxide films, a hard-bake at elevated temperature can be applied to condense the photoresist into an amorphous metal oxide or to induce crystallization.

A chemical treatment can include, for example, contacting the patterned photoresist layer with the vapors of a volatile Lewis acid, such as hydrochloric acid, sulfuric acid, nitric acid, or a sulfonic acid. In each type of treatment, the chemical alteration of the photoresist is preferentially uniformly distributed throughout the treated photoresist, not just at the surface. The post-development chemical treatment can cause a chemical change in the revealed surface of the substrate, producing after removal of the photoresist features a chemically patterned surface of the substrate.

Etching includes any common etching technique applied in the manufacture of semiconductor devices, for example, dry-etching such as plasma etching, ion beam etching, or wet-etching using selective solvents. Typically, dry etching processes are employed for etching at sub-50 nm dimensions.

The substrate, and more particularly the surface of the substrate, can comprise inorganic or organic materials such as metals, carbon, or polymers. More particularly, the substrate can comprise any semiconducting material including, for example, Si, SiGe, SiGeC, SiC, Ge alloys, GaAs, InAs, InP, as well as other III-V or II-VI compound semiconductors. The substrate can also comprise a layered semiconductor such as Si/SiGe, or a semiconductor-on-insulator (SOI). In particular, the substrate can contain a Si-containing semiconductor material (i.e., a semiconductor material that includes Si) such as, for example, silicon dioxide, silicon nitride, and quartz. The semiconductor material can be doped, undoped or contain both doped and undoped regions therein.

Figure 2:
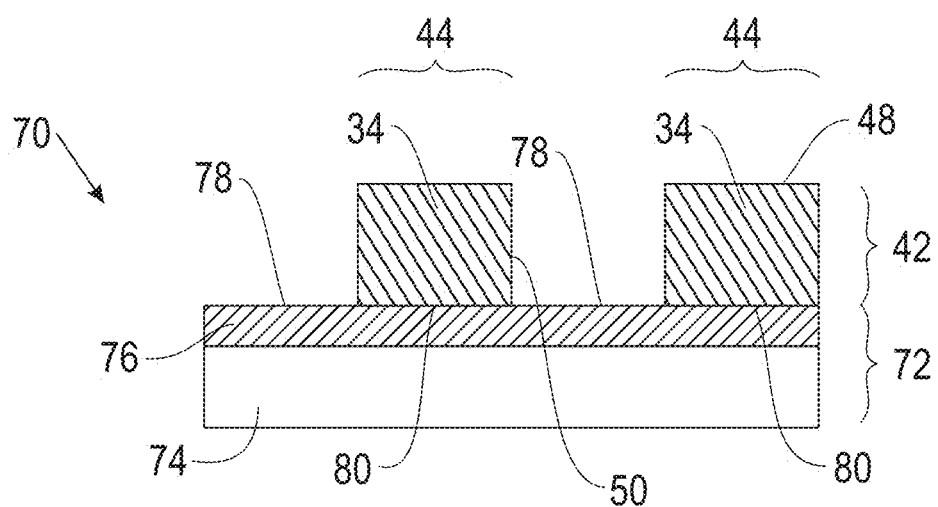
FIG. 2 is a schematic layer diagram of a multi-layered structure that includes a topographical patterned layer comprising exposed photoresist composition disposed on a two layered substrate. The photoresist composition was prepared using the disclosed peroxo complex.

To further illustrate a multi-layered substrate, structure 40 of FIG. 1D is reproduced in structure 70 of FIG. 2, with the exception that substrate 72 of FIG. 2 has two layers, a bottom layer 74 and an intermediate layer 76. Bottom layer 74 of substrate 72 can be, for example, a silicon wafer. Intermediate layer 76 can be, for example, an ARC layer. In this example, surface 78 is a surface of the ARC layer in contact with air, and photoresist features 44 are disposed on ARC surface 80.
Photoresist Compositions.

The photoresist composition comprises a peroxo complex, a solvent, and optionally selected additives that do not adversely affect the desirable properties of the photoresist layer, such as developability and/or etch resistance. Exemplary optional additives include materials that act to improve the photospeed by increasing the crosslinking efficiency or by increasing the polarity changes that occur on exposure. For example, photsensitizers can be used to improve the efficiency of ligand loss in the peroxo complex leading to higher crosslink density. Higher crosslinking efficiency can also be achieved by employing additives that act to catalyze polycondensation reactions that can occur in parallel with other crosslinking that happens on exposure. Examples of this type of additive include photoacid generators and photobase generators. The optional additives can be used singly or in combination.

Exemplary solvents include water and aqueous solutions, including aqueous hydrogen peroxide, aqueous acids, aqueous bases, aqueous salt solutions, and aqueous organic solvent mixtures. The photoresist composition can include an organic solvent to dissolve the other components, so that the peroxo complex can be disposed evenly on the surface of the substrate to provide a defect-free coating. Organic solvents for casting the photoresist composition include alcohols, ethers, glycol ethers, alkylene glycol monoalkyl esters, aromatic hydrocarbons, ketones, esters, and combinations thereof. Specific exemplary casting solvents include carbon dioxide, ethyl lactate, butyl acetate, 2-ethoxyethanol, gamma-butyrolactone, cyclopentanone, cyclohexanone, methyl cellosolve, ethoxyethylpropionate (EEP), a combination of EEP and gamma-butyrolactone (GBL), propylene glycol methyl ether acetate (PGMEA), and mixtures thereof.

A photoacid generator (PAG) is capable of releasing or generating acid upon exposure to radiation. Examples of photochemical acid generators (PAGs) include, but are not limited to, sulfonates, onium salts, aromatic diazonium salts, sulfonium salts, diaryliodonium salts, sulfonic acid esters of N-hydroxyamides, sulfonic acid esters of N-hydroxyimides, and combinations thereof.

A photobase generator (PBG) generates a base upon exposure to radiation. Photobase generators include quaternary ammonium dithiocarbamates, alpha aminoketones, oxime-urethane containing molecules such as dibenzophenone-oxime hexamethylene diurethane, ammonium tetraorganylborate salts, N-(2-nitrobenzyloxycarbonyl)cyclic amines, and combinations thereof.

The photoresist composition can comprise a surfactant. Surfactants can be used to improve coating uniformity, and can include ionic, non-ionic, monomeric, oligomeric, and polymeric species, or combinations thereof. Examples of possible surfactants include fluorine-containing surfactants such as the FLUORAD series available from 3M Company in St. Paul, Minn., and siloxane-containing surfactants such as the SILWET series available from Dow Chemical.

The photoresist composition can comprise a sensitizer. Sensitizers include polycyclic aromatics such as pyrene, perylene, bis(4-hydroxy-2,3,5-trimethylphenyl)-2-hydroxyphenylmethane, 1,4-bis[1-(3,5-dimethyl-4-hydroxyphenyl) isopropyl]benzene, 2,4-bis(3,5-dimethyl-4-hydroxyphenyl-methyl)-6-methylphenol, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, 1-[1-(4-hydroxyphenyl) isopropyl]-4-[1,1-bis(4-hydroxyphenyl)ethyl]benzene, 1-[1-(3-methyl-4-hydroxyphenyl)isopropyl]-4-[1,1-bis(3-methy 1-4-hydroxyphenyl)ethyl]benzene, 2,6-bis[1-(2,4-dihydroxyphenyl)isopropyl]-4-methylphenol, 4,6-bis[1-(4-hydroxyphenyl)isopropyl]resorcin, 4,6-bis(3,5-dimethoxy-4-hydroxyphenylmethyl)pyrogallol, 4,6-bis(3,5-dimethyl-4-hydroxyphenylmethyl)pyrogallol, 2,6-bis(3-methyl-4,6-dihydroxyphenylmethyl)-4-methylphenol, 2,6-bis(2,3,4-trihydroxyphenylmethyl)-4-methylphenol, 1,1-bis(4-hydroxyphenyl)cyclohexane, and combinations thereof.

A wide variety of compounds with varying basicity can be used as stabilizers and acid-diffusion controlling additives. They can include nitrogenous compounds such as aliphatic primary, secondary, and tertiary amines, cyclic amines such as piperidines, pyrimidines, morpholines, aromatic heterocycles such as pyridines, pyrimidines, purines, imines such as diazabicycloundecene, guanidines, imides, amides, and others. Ammonium salts can also be used, including ammonium, primary, secondary, tertiary, and quaternary alkyl- and arylammonium salts of alkoxides including hydroxide, phenolates, carboxylates, aryl and alkyl sulfonates, sulfonamides, and others. Other cationic nitrogenous compounds including pyridinium salts and salts of other heterocyclic nitrogenous compounds with anions such as alkoxides including hydroxide, phenolates, carboxylates, aryl and alkyl sulfonates, sulfonamides, and the like can also be employed. In an embodiment, the photoresist composition comprises hydrogen peroxide as a stabilizer for the peroxo complex in aqueous solution.

The photoresist composition can comprise a peroxo complex in an amount of about 1 wt % to about 30 wt % (weight percent), more particularly about 2 wt % to about 15 wt %, based on the total weight of the photoresist composition excluding solvents (i.e., total solids weight of the photoresist composition).

The photoresist composition can comprise a photoacid generator in an amount of about 0.5 wt % to about 20 wt %, more particularly about 0.5 wt % to about 10 wt % of based on the total solids weight of the photoresist composition.

The photoresist composition can comprise a photobase generator in an amount of about 0.01 wt % to about 20 wt %, more particularly from about 0.1 wt % to about 10 wt % based on the total solids weight of the photoresist composition.

The photoresist composition can include surfactant in an amount of about 0.001 wt % to about 0.1 wt % based on the total weight of the photoresist composition.

The photoresist composition can comprise solvent in an amount of about 70 wt % to about 99 wt %, more particularly from about 85 wt % to about 98 wt % of the based on the total weight of the photoresist composition.

The photoresist composition can comprise sensitizer in an amount of about 0.1 wt % to about 30 wt %, more particularly from about 0.1 wt % to about 20 wt % based on the total solids weight of the photoresist composition.

The photoresist composition can comprise a stabilizer in an amount of about 0.1 wt % to about 30 wt %, more particularly from about 0.1 wt % to about 20 wt % based on the total weight of the photoresist composition. In an embodiment, the stabilizer is hydrogen peroxide.

Typically, the sum of all customary additives is less than 20 wt %, preferably less than 5 wt % based on the total solids weight of the photoresist composition. In an embodiment, the photoresist composition comprises a metal salt comprising a metal ion selected from the group consisting of Titanium (IV), Niobium (V) or Tantalum (V), an organic carboxylic acid in an amount of 0.5 to 3.0 molar equivalents relative to moles of the metal ion, hydrogen peroxide in an amount of 1.0 to 10.0 molar equivalents relative to moles of the metal ion, and a solvent. In another embodiment, the organic carboxylic acid is present in an amount of 0.75 to 1.5 molar equivalents relative to moles of the metal ion. In another embodiment, the organic carboxylic acid is present in an amount of 0.9 to 1.1 molar equivalents relative to moles of the metal ion.

The photoresist layer can be formed by processes such as spin coating (also referred to as spin casting), spray coating, dip coating, doctor blading, roll coating, and the like, which can be used individually or in combinations thereof in accordance with the methods of the present invention. More particularly, a solution of the photoresist in a suitable solvent is spin coated onto the surface of the substrate, followed by removal of the solvent to produce the photoresist layer.

In general, the photoresist layer can have a thickness of 100 to 100000 angstroms (0.01 to 10 micrometers), more particularly 200 to 5000 angstroms, and even more particularly 200 to 3000 angstroms.

A photoresist feature of the patterned photoresist layer can have a height of 10 to 10000 angstroms, 100 to 3000 angstroms, or more particularly 200 to 1500 angstroms.

The photoresist layer can be heated in what is termed a post-application bake at a temperature of 50° C. to 300° C., more particularly 50° C. to 250° C., for a period of 1 sec to 1 hour, and still more particularly 10 sec to 10 minutes.

Pattern-wise exposure of the photoresist layer can be accomplished using radiation of various types, including ultraviolet (UV) radiation of wavelengths from 450 nm to 300 nm, deep ultraviolet (DUV) radiation of wavelengths from 300 nm to 120 nm, extreme ultraviolet (EUV) radiation of wavelengths from 120 nm to 8 nm, electron-beam (e-beam)

radiation, x-ray radiation, combinations of the foregoing, and other suitable sources. Examples include 193 nm ArF excimer source, an EUV source, or an electron beam. DUV and EUV exposures employ a specific mask to generate patterns in the negative-working photoresist layer. E-beam lithography writes patterns directly to the photoresist. Exemplary radiation sources include single wavelength and/or narrow band radiation sources, Sn plasma sources for EUV, specific mercury emission lines, lasers, and particle beam emitters. For less stringent conditions, a broad band multiple wavelength source can be used. More particularly, the radiation wavelength is selected from the group consisting of 436 nm, 405 nm, 365 nm, 334 nm, 313 nm, 254 nm, 248 nm, 193 nm, 157 nm, 126 nm, and 13.5 nm. Even more particularly, the wavelength of the radiation is selected from the group consisting of 248 nm, 193 nm, 157 nm, and 13.5 nm. Still more specifically, the wavelength of the radiation for the pattern-wise exposure can be 193 nm or 13.5 nm.

The pattern-wise exposure can be performed either dry or under immersion conditions, particularly immersion conditions utilizing a high index of refraction fluid between the lens element and the wafer. Immersion fluids include water and other high index fluids such as decane and various fluorinated solvents. More specifically, the pattern-wise exposure can be accomplished by 193 nm water-immersion lithography. In order to accommodate patterning by 193 nm water-immersion lithography, a protective topcoat layer can be applied to the surface of the photoresist prior to exposure via immersion lithography. For example, silation or another suitable technique can be used to modify the wetting properties of the film with respect to the immersion fluid. Preferably, the topcoat layer is base-soluble and is removed during the photoresist development step by the alkaline photoresist developer. Alternatively, the photoresist can comprise surface-active components that control the surface properties of the coated photoresist and limit the extraction of photoresist components into the immersion fluid.

The developer can comprise water and/or an organic solvent. The pattern-wise exposed photoresist layer is preferably developed with water or an aqueous alkaline developer. A patterned photoresist layer can be formed by selectively removing the non-exposed photoresist with an aqueous developer. The patterned photoresist layer is disposed on a first surface of the substrate. A second surface of the substrate can have substantially no residual photoresist disposed thereon, or no residual photoresist disposed thereon.

Exemplary organic solvents for developers include anisole, ethylene glycol, propylene glycol, and 4-methyl-2-pentanol, n-butyl acetate, and mixtures thereof. The developer can also include a supercritical fluid, such as liquefied methane, liquefied ethane, liquefied propane, or liquefied carbon dioxide. The non-alkaline developer comprising supercritical fluids can further comprise additional components including organic solvents, surfactants, and salts in order to modify various properties of the developer.

The wafers can be reworked. Reworking a wafer can occur, for example, when post-development inspection detects unacceptable defects (e.g., misalignment) in the photoresist pattern. The wafer can be solvent stripped using for example 0.26N TMAH or dilute hydrogen peroxide to remove the photoresist before the wafer is etched or otherwise irreversibly altered. The wafer can then be resubmitted to the photoresist pattern generating process.

The present invention also relates to the use of the composition solution for the imaging and formation of patterned metal oxide films. In such a case, a hard-bake at elevated temperatures can be applied to condense the material into an amorphous metal oxide or to induce crystallization.

Also disclosed are the layered structures formed using the above-described methods. In one embodiment, the layered structure is a semiconductor device. The semiconductor device comprises a substrate comprising an anti-reflection surface; and a developed patterned photoresist layer comprising radiation exposed photoresist disposed on a first area of the anti-reflection surface. The patterned photoresist layer can be in the form of a topographical relief pattern comprising, for example, a pattern of openings derived by selective removal of non-exposed photoresist.

In the manufacture of integrated circuits, circuit patterns can be formed in the exposed areas after photoresist development by coating the patterned substrate with a conductive material, e.g., a metallic material, using known techniques such as evaporation, sputtering, plating, chemical vapor deposition, or laser-induced deposition. Dielectric materials can be deposited by similar means during the process of making circuits. Inorganic ions such as boron, phosphorous, or arsenic can be implanted in the substrate in the process for making p-doped or n-doped circuit transistors. It should be understood that the invention is not limited to any specific lithographic technique or device structure.

The above-described peroxo complexes and methods permit a photoresist feature width of from 1 to 1000 nm, from 1 to 500 nm, from 1 to 300 nm, from 1 to 200 nm, from 1 to 150 nm, or more particularly from 1 to 100 nm.

The peroxo complexes and methods are further illustrated by the following examples.

EXAMPLES

Materials used in the following examples are listed in Table 1.

TABLE 1

| ABBREVIATION | DESCRIPTION | SUPPLIER |
|---|---|---|
| TMAH | Tetramethylammonium Hydroxide, 0.26N developer, OPD 7262 | Fujifilm Electronic Materials, U.S.A Inc. |
| $TaCl_5$ | Tantalum (V) Chloride, MW 358.2 | Sigma-Aldrich |
| $NbCl_5$ | Niobium (V) Chloride, MW 270.2 | Sigma-Aldrich |
| | Titanium (IV) Isopropoxide, MW 284.3 | Sigma-Aldrich |
| Lactic Acid | L-(+)-Lactic Acid, 88-92% Puriss., solution in water, MW 90.1 | Sigma-Aldrich |
| | Oxalic Acid, MW 90.0 | Sigma-Aldrich |
| | Glycolic Acid, MW 76.1 | Sigma-Aldrich |
| $H_2O_2$ | Hydrogen Peroxide, 30 wt % in water, MW 34.0 | J. T Baker, Avantor Performance Materials Inc. |

The following examples demonstrate the preparation and use of the disclosed peroxo complexes. Unless indicated otherwise, parts are parts by weight, temperature is in degree Centigrade (° C.) and pressure is at or near atmospheric. All chemicals and materials were obtained commercially or were synthesized using known procedures.

Lithographic Imaging—General Procedures.

Photoresist solutions were filtered through a 0.2 micrometer nylon filter prior to spin casting at 3000 rpm for 30 sec. Typical film thicknesses ranged from 20 nm to 60 nm after casting. Si wafers were plasma treated in a March PX-250 ($O_2$, 15 sec) prior to use as substrates. Thickness measurements were obtained using a Nanospec 6100 (Nanometrics). Contrast curves using a 193 nm light source were obtained using a thermal gradient plate as described by Larson, et al., Proc. SPIE 5376, 1165-1173 (2004). Exposure at 193 nm was performed either on an Ultratech 193 nm ministepper (0.6 NA, binary chrome on glass mask) or a home-built interferometric lithography system "NEMO". Electron beam exposure was performed using a Vistec VB6 at 100 keV energy, 0.5 nA current and 15 nm spot size (Gaussian shape beam). Exposure at EUV (13.5 nm) was performed on the SEMATECH Berkeley Microfield Exposure Tool (0.3 NA) at the Advanced Light Source at Lawrence Berkeley National Laboratory.

Example 1

Carboxylato Peroxo Complex Based on Tantalum (V) and Lactic Acid

A carboxylato peroxo complex based on Tantalum (V) and lactic acid with a reported formula of $[NH_4]_4[Ta_2(O_2)_2(C_3H_4O_3)_4O]$ was synthesized based on standard literature procedure (Petrykin et al., Inorganic Chemistry, 9251-9256, 2006). $TaCl_5$ (1 g, 2.79 mmol, MW 358.21) was dissolved in approximately 1 ml methanol and diluted in 15 ml of water. To this was added $NH_4OH$ (30 wt %) until the pH reached approximately 10. The precipitated material was isolated by centrifugation and repeatedly washed with water until $Cl^-$ could not be detected by $Ag^+$ test. Lactic acid solution (0.56 g (solution), 0.503 g (solids), 5.58 mmol, 2 eq.) and 7 ml concentrated $H_2O_2$ (about 30 wt %) was added and the mixture cooled in an ice bath. The pH was then brought up slowly and maintained at 5.6 by periodic additions of concentrated $NH_4OH$ resulting in a transparent solution. The solution was filtered (0.45 micron) and stored at $-4°$ C.

Figure 3:
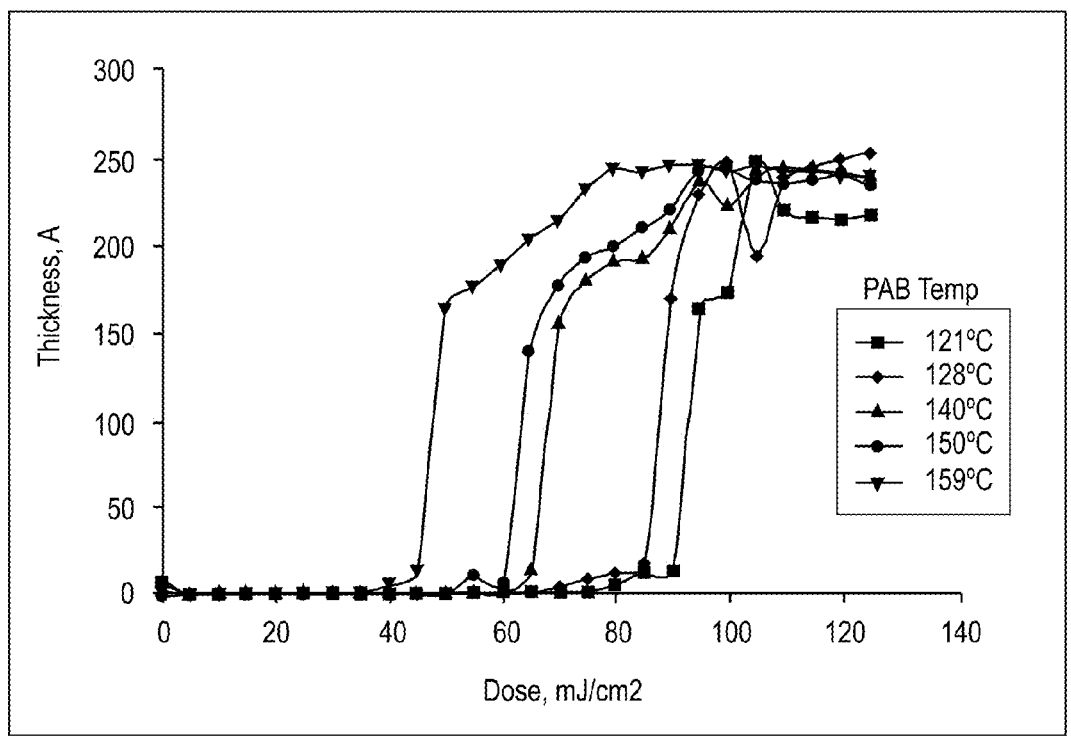
FIG. 3 is a graph showing a series of contrast curves (thickness in Angstroms as a function of dose in mJ/cm$^2$) obtained for 193 nm exposures given different post application bakes (PAB) using the photoresist composition prepared in Example 1. Each film was given a post-exposure bake (PEB) of 100° C. for 60 sec and a 30 sec development in water. The resulting negative-tone pattern comprised exposed photoresist.
Figure 4:
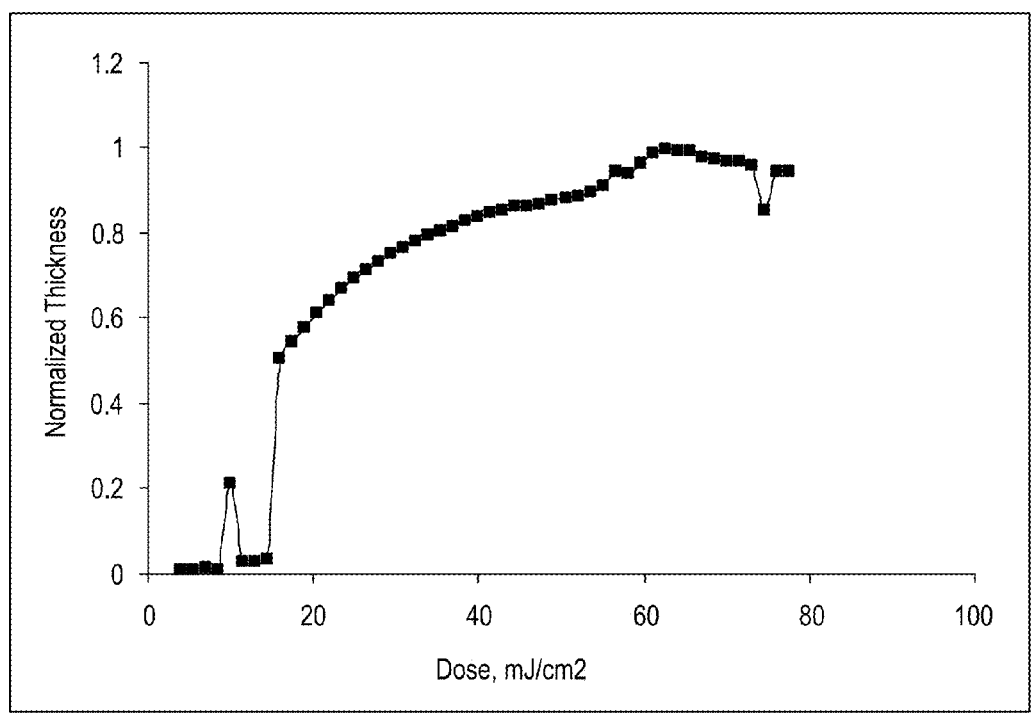
FIG. 4 is a graph showing a contrast curve obtained using EUV exposure at 13.5 nm and the following process conditions: PAB and PEB 130° C. for 60 sec, and 30 sec water development using the photoresist composition prepared in Example 1.
Figure 5:
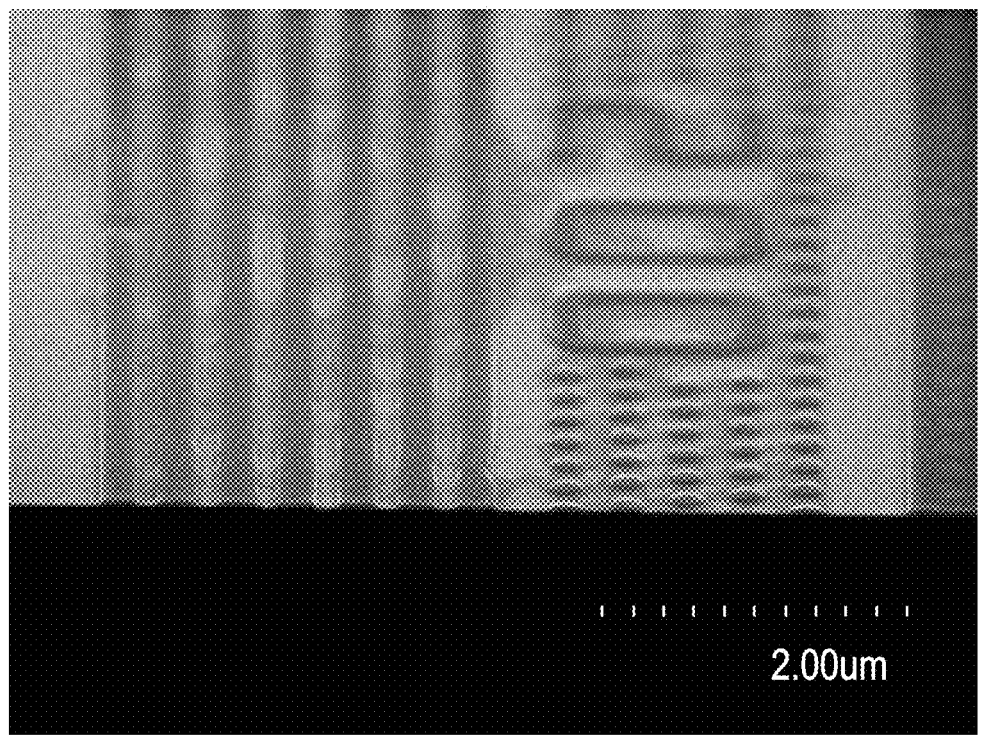
FIG. 5 is a scanning electron micrograph (SEM) image of the line pattern obtained using the photoresist composition prepared in Example 1 and the following exposure/process conditions: 193 nm exposure (150 mJ/cm$^2$), PAB and PEB 145° C. for 60 sec, and 30 sec water development.

Photoresist compositions were formulated as 10 wt % (weight percent) of the peroxo complex in 20 wt % to 30 wt % aqueous peroxide solutions, wherein wt % is based on on total weight of the solution. FIG. 3 is a graph showing a series of contrast curves (thickness in Angstroms as a function of dose in $mJ/cm^2$) obtained for 193 nm exposed films using different post application bakes (PAB) in a range of 121° C. to 159° C. for 60 sec. Each film was given a post-exposure bake (PEB) of 100° C. for 60 sec and a 30 second development in water. Good contrast was obtained using water as the developer. FIG. 4 is a graph showing a contrast curve obtained using EUV exposure (13.5 nm) and the following process conditions: PAB and PEB 130° C. for 60 sec, and 30 second water development. Good sensitivity was observed. FIG. 5 is a scanning electron micrograph (SEM) image of a patterned photoresist layer obtained using 193 nm exposure (150 $mJ/cm^2$) and the following process conditions: PEB and PAB 145° C. for 60 sec, and 30 sec water development.

Example 2

Carboxylato Peroxo Complex Based on Tantalum (V) and Oxalic Acid

Chloride route. A carboxylato peroxo complex based on Tantalum (V) and oxalic acid with a formula of $[NH_4]_3[Ta(O_2)_3(C_2O_4)]$ was prepared as follows. $TaCl_5$ (1 g, 2.79 mmol, MW 358.2) was dissolved in 1.5 ml methanol, diluted in 15 ml of water and filtered through a 0.45 micron syringe filter. To this solution was added $NH_4OH$ (30 wt %) until the pH reached approximately 10. The precipitated material was isolated by centrifugation and repeatedly washed with water until $Cl^-$ could not be detected by $Ag^+$ test. Concentrated $H_2O_2$ (7 ml, 30 wt %) and oxalic acid (250 mg, 1 eq., MW 90.0) were added and the mixture was cooled in an ice bath. The pH was then brought up slowly and maintained at 5.6 by periodic additions of concentrated $NH_4OH$ resulting in a transparent solution. The solution was filtered (0.45 micron) and stored at $-4°$ C. Precipitation with ethanol yielded a white powder which was washed with ethanol and dried under vacuum. Calculated: H, (2.89); C, (5.73); N, (10.03); O, (38.18); Ta, (43.18). Found (chloride route): C, (4.86); N, (9.83); Ta, (40.3); Cl 61 ppm.

Chloride free route. The carboxylato peroxo complex based on Tantalum (V) and oxalic acid with a formula of $[NH_4]_3[Ta(O_2)_3(C_2O_4)]$ was also prepared from tantalum ethoxide as follows. To $Ta(OCH_2CH_3)_5$ (2.26 g, MW 406.25) was added 7 ml $NH_4OH$ (30 wt %) and water to a total volume of 35 ml. The precipitated material was isolated by centrifugation and washed twice with water. Oxalic acid (503.6 mg, MW 90.0) and concentrated $H_2O_2$ (14 ml, 30 wt %) were added and the mixture was cooled in an ice bath. The pH was then brought up slowly and maintained at 5.7 by periodic additions of concentrated $NH_4OH$ resulting in a transparent solution. The solution was filtered (0.45 micron) and stored at $-4°$ C. Precipitation with ethanol yielded a white powder which was washed with ethanol and dried under vacuum. Calculated: H, (2.89); C, (5.73); N, (10.03); O, (38.18); Ta, (43.18). Found (chloride-free route): C, (6.34); N, (9.79); Ta, (39.7); Cl, <58 ppm.

Figure 6:
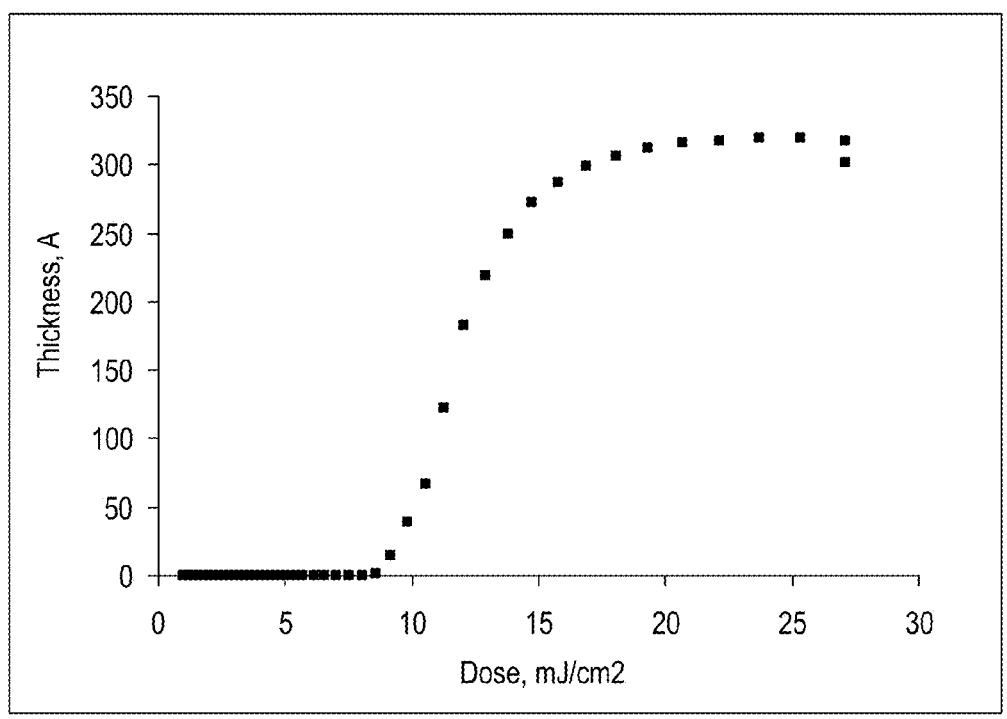
FIG. 6 is a graph showing the contrast curve (thickness in Angstroms as a function of dose in mJ/cm$^2$) obtained for EUV exposures at 13.5 nm using the photoresist composition prepared in Example 2 and the following process conditions: PAB 300 sec at 150° C., 20 sec water rinse carried out after PAB, PEB 60 sec at 150° C., and 60 sec development in 0.26 N TMAH.

A photoresist composition was formulated using the peroxo complex formed by the chloride route as 10 wt % solids in 20 wt % to 30 wt % aqueous hydrogen peroxide solutions. FIG. 6 is a graph showing the contrast curve (thickness in Angstroms as a function of dose in $mJ/cm^2$) obtained for EUV exposure (13.5 nm) using the following process conditions: PAB 300 sec at 150° C., 20 sec water rinse carried out after PAB, PEB 60 sec at 150° C., and 60 sec development in 0.26 N TMAH.

Figures 7A, 7B, 7C:
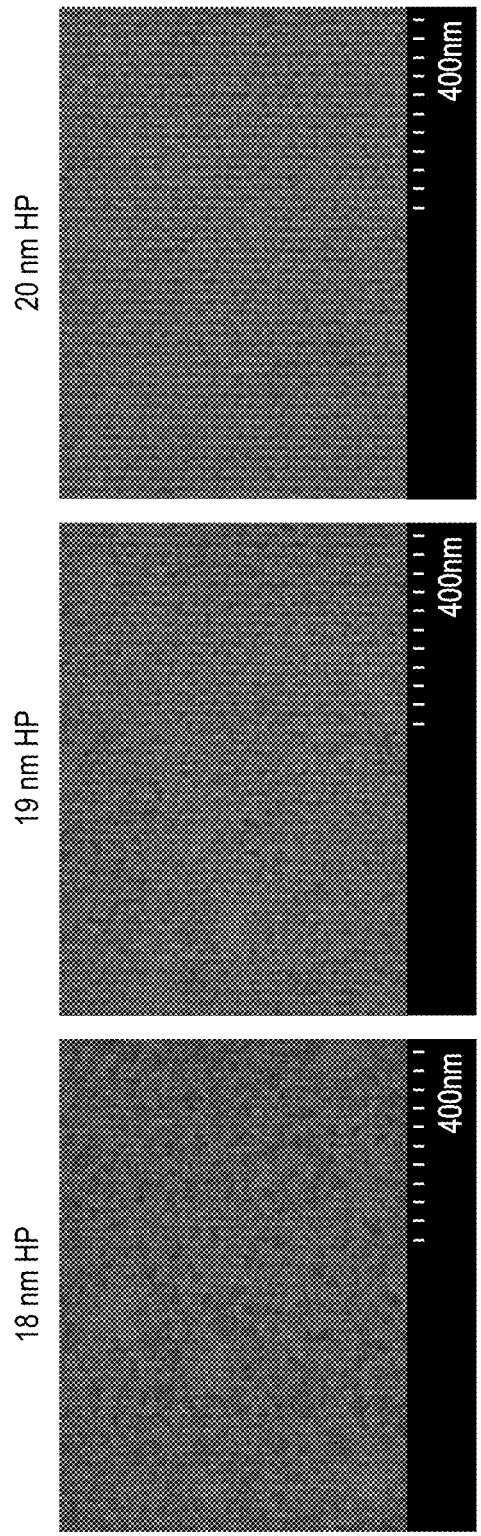
FIGS. 7A to 7C are SEM images of 18 nm half-pitch (HP) (FIG. 7A), 19 nm HP (FIG. 7B), and 20 nm HP (FIG. 7C) line patterns obtained using the photoresist composition prepared in Example 2 and the following exposure/process conditions: EUV exposure (13.5 nm, 37.8 mJ/cm$^2$), PAB 300 sec at 150° C., 20 sec water rinse carried out after PAB, PEB 60 sec at 150° C., and 60 sec development in 0.26 N TMAH.

FIGS. 7A to 7C are SEM images of 18 nm half-pitch (HP) (FIG. 7A), 19 nm HP (FIG. 7B), and 20 nm HP (FIG. 7C) line patterns obtained with the photoresist composition of Example 2 using EUV (13.5 nm, 37.8 $mJ/cm^2$) exposures and the following process conditions: PAB 300 sec at 150° C., 20 sec water rinse carried out after PAB, PEB 60 sec at 150° C., and 60 sec development in 0.26 N TMAH.

Figure 8:
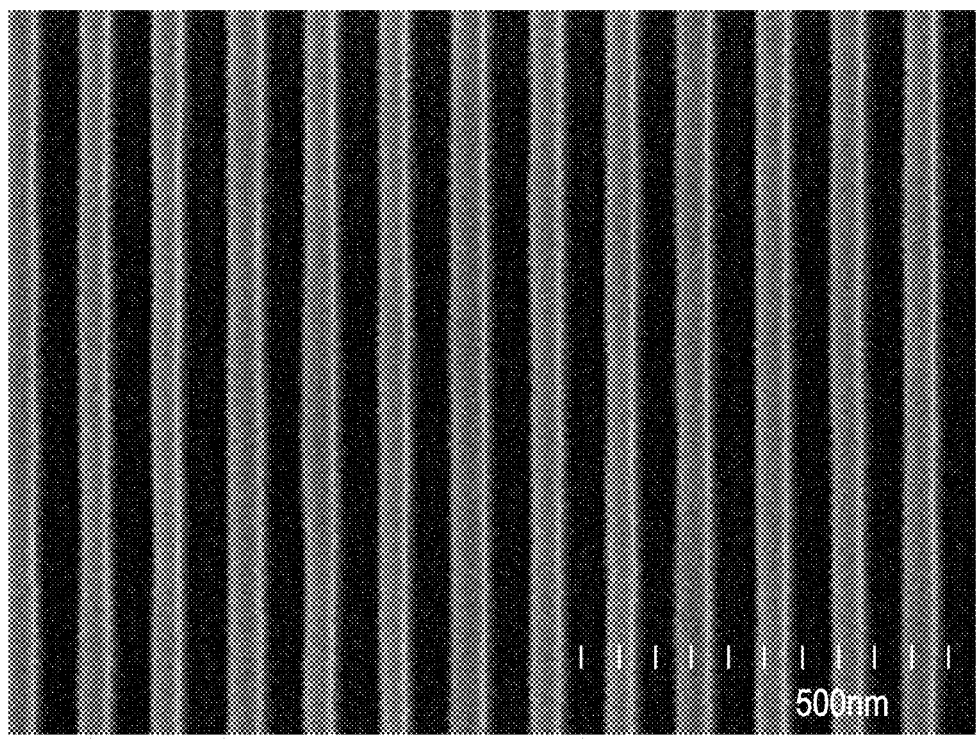
FIG. 8 is an SEM image of a 50 nm HP line pattern obtained with the photoresist composition of Example 2 using interferometric lithography at 193 nm (10.1 mJ/cm$^2$) and the following process conditions: PAB 300 sec at 150° C., PEB 60 sec at 150° C., and 60 sec development in 0.26 N TMAH.

FIG. 8 is an SEM image of 50 nm HP line pattern obtained with the photoresist composition of Example 2 using interferometric lithography at 193 nm (10.1 $mJ/cm^2$) and the following process conditions: PAB 300 sec at 150° C., PEB 60 sec at 150° C., and 60 sec development in 0.26 N TMAH.

FIGS. 9A to 9C are SEM images of 130 nm line space (L/S) patterns (i.e., L/S means the lines and spaces have equal width), 140 nm L/S, and 150 nm L/S, respectively, obtained with the photoresist composition of Example 2 using 193 nm (18 $mJ/cm^2$) lithography and the following process conditions: PAB 300 sec at 150° C., PEB 60 sec at 150° C., and 60 sec development in 0.26 N TMAH.

Figures 10A, 10B:
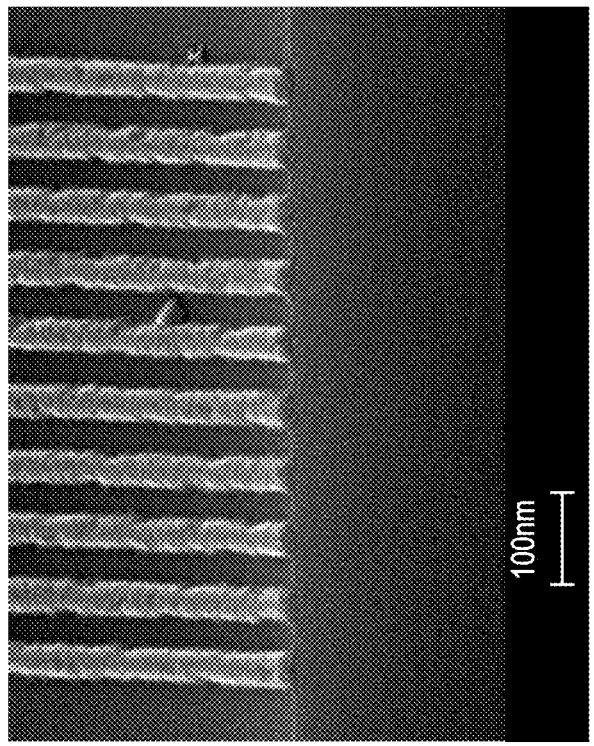
FIGS. 10A to 10B are SEM images of 30 nm HP and 40 nm HP line patterns, respectively, obtained with the photoresist composition of Example 2 using electron beam (e-beam) lithography and the following conditions: exposure 1500 microCoulombs/cm$^2$, PAB 300 sec at 150° C., PEB 60 sec at 150° C., and 60 sec development in 0.26 N TMAH.

FIGS. 10A to 10B are SEM images of 30 nm HP and 40 nm HP line patterns, respectively, obtained with the photoresist composition of Example 2 using electron beam (e-beam) lithography and the following conditions: exposure 1500 microCoulombs/$cm^2$, PAB 300 sec at 150° C., PEB 60 sec at 150° C., and 60 sec development in 0.26 N TMAH.

Figure 11:
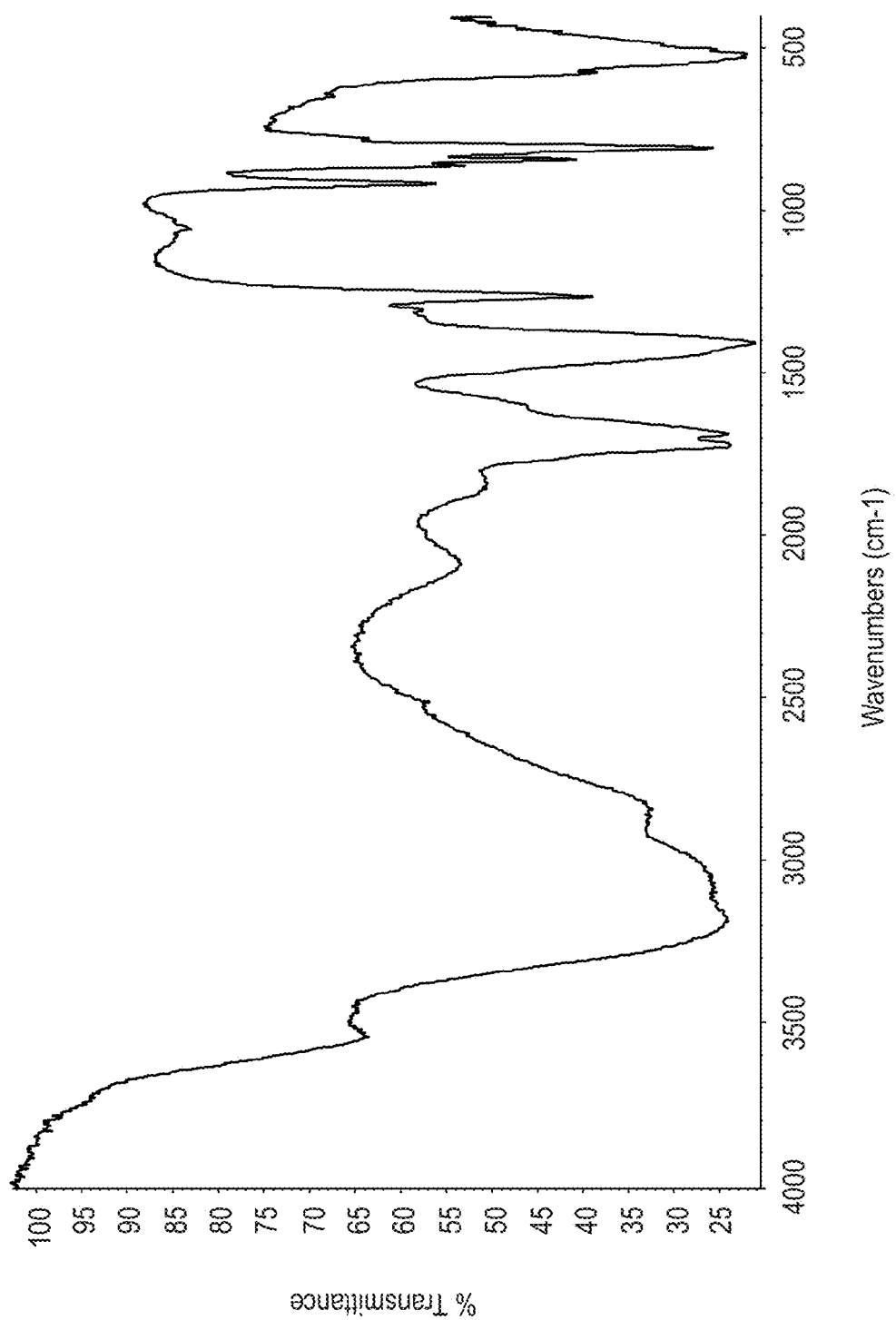
FIG. 11 is a diffuse reflectance FTIR (in KBr) spectrum of the compound in Example 2.

FIG. 11 is a diffuse reflectance FTIR (in KBr) spectrum of the peroxo complex of Example 2.

Example 3

Carboxylato Peroxo Complex Based on Tantalum (V) and Glycolic Acid

A carboxylato peroxo complex based on Tantalum (V) and glycolic acid with a formula of $[NH_4]_4[Ta_2(O_2)_2(C_2H_2O_3)_4O]$ was prepared as follows. $TaCl_5$ (1 g, 2.79 mmol, MW 358.2) was dissolved in 1.5 ml methanol, diluted in 15 ml of water and filtered through a 0.45 micrometer syringe filter. To this solution was added $NH_4OH$ (30 wt %) until the pH reached 10. The precipitated material was isolated by centrifugation and repeatedly washed with water until chloride ion could not be detected by $Ag^+$ test. In an ice bath, a total of 8 ml concentrated $H_2O_2$ (8 ml, 30 wt %), glycolic acid (421 mg, 2 eq., MW 76.1) and enough concentrated $NH_4OH$ to bring the solution to pH 5.6 was added to the precipitate, producing a transparent solution. The solution was filtered (0.45 micrometer) and stored at −4° C. The final solution served as the photoresist composition.

Figure 12:
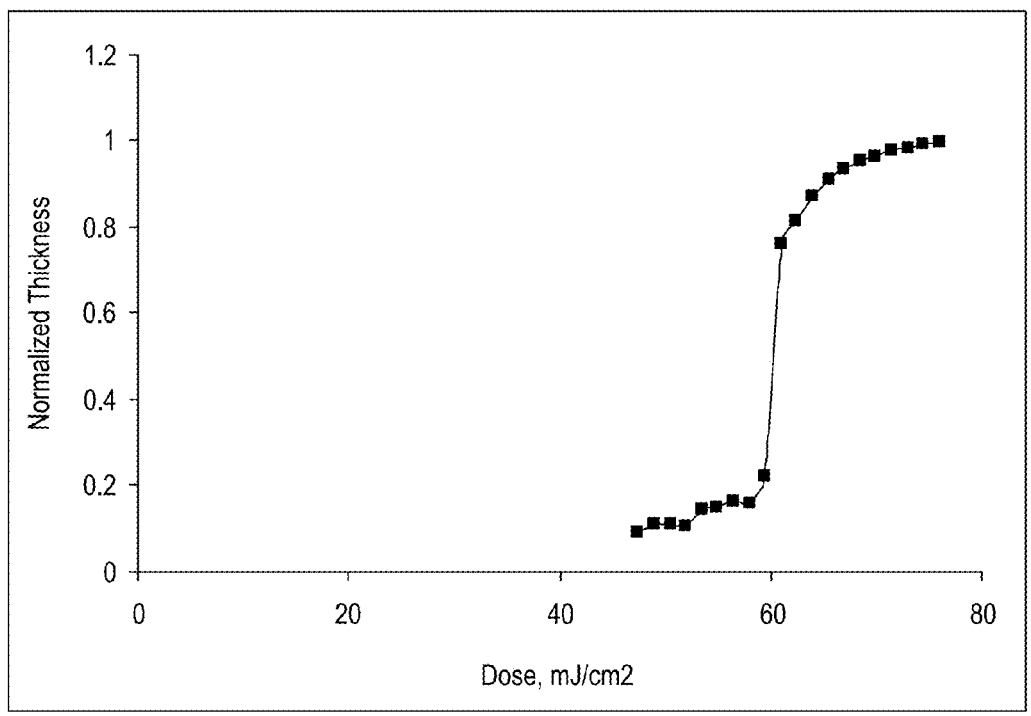
FIG. 12 is a graph showing the contrast curve (thickness in Angstroms as a function of dose in mJ/cm$^2$) obtained with the photoresist composition of Example 3 using EUV exposure 13.5 nm and the following process conditions: PAB 60 sec at 120° C., PEB 60 sec at 120° C., and 30 sec development in water.

FIG. 12 is a graph showing the contrast curve (thickness in Angstroms as a function of dose in $mJ/cm^2$) obtained with the photoresist composition of Example 3 using EUV exposure (13.5 nm) and the following process conditions: PAB 60 sec at 120° C., PEB 60 sec at 120° C., 30 sec development in water.

Example 4

Carboxylato Peroxo Complex Based on Nb and Lactic Acid

A carboxylato peroxo complex based on Nb and lactic acid with a formula of $[NH_4]_4[Nb_2(O_2)_2(C_3H_4O_3)_4O]$ was prepared as follows. $NbCl_5$ (1 g, 3.7 mmol, MW 270.2) was dissolved in 1.5 ml methanol and diluted in 15 ml of water. To this was added $NH_4OH$ (30 wt %) until the pH reached 10. The precipitated material was isolated by centrifugation and repeatedly washed with water until $Cl^-$ could not be detected by $Ag^+$ test. Lactic acid (0.75 g (solution), 0.67 g (solids), 7.44 mmol, 2 eq., MW 90.1) and 7 ml concentrated $H_2O_2$ (30 wt %) was added and the mixture cooled in an ice bath. The pH was then brought up slowly and maintained at 5.6 by periodic additions of concentrated $NH_4OH$ resulting in a transparent solution. The solution was filtered (0.45 micrometer) and stored at −4° C. The final solution served as the photoresist composition.

Figure 13:
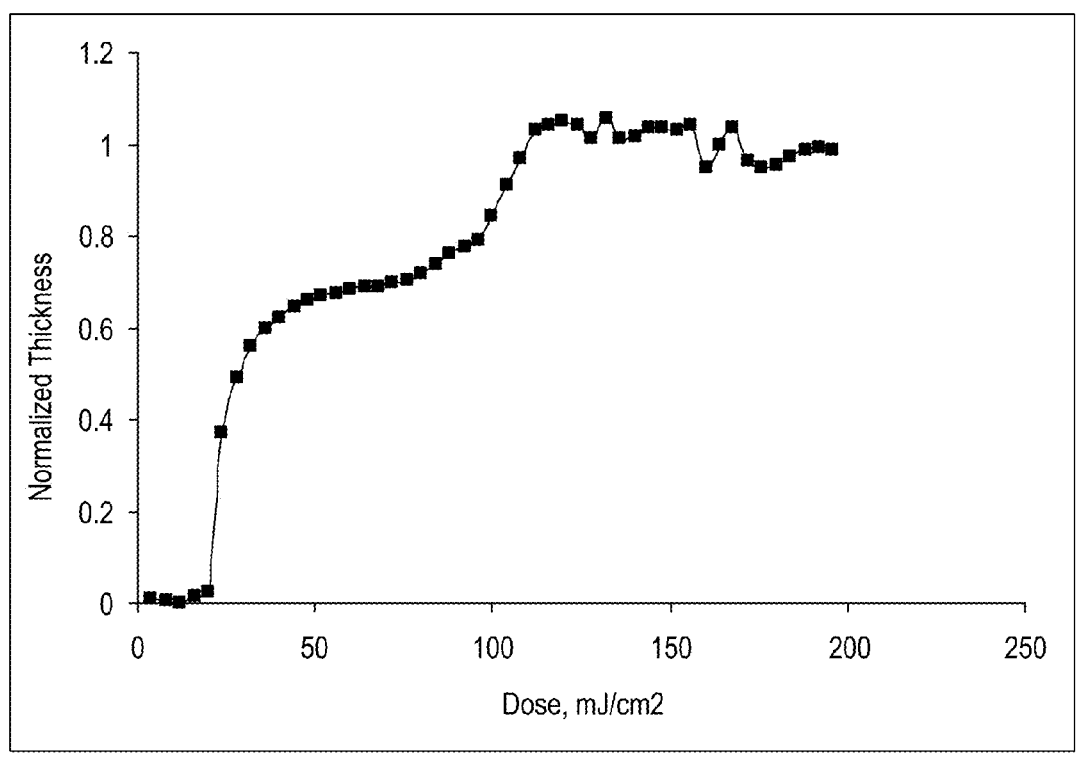
FIG. 13 is a graph showing the contrast curve (thickness in Angstroms as a function of dose in mJ/cm$^2$) obtained with the photoresist composition of Example 4 using EUV exposure 13.5 nm and the following process conditions: PAB 60 sec at 160° C., PEB 60 sec at 160° C., and 30 sec development in water.

FIG. 13 is a graph showing the contrast curve obtained with the photoresist composition of Example 4 using EUV exposure (13.5 nm) and the following process conditions: PAB 60 sec at 160° C., PEB 60 sec at 160° C., and 30 sec development in water.

Example 5

Carboxylato Peroxo Complex Based on Ti and Oxalic Acid

A carboxylato peroxo complex based on Ti and oxalic acid with a formula of $[NH_4]_2[Ti(O_2)_2(C_2O_4)]$ was prepared as follows. Titanium isopropoxide (0.4 g, 1.40 mmol, MW 284.3) was added to oxalic acid (0.125 g, 1 eq., MW 90.0). In an ice bath, concentrated $H_2O_2$ (3.2 ml, 30 wt %) was then added followed by $NH_4OH$ yielding a transparent red solution indicative of a titanium peroxo complex. The final solution served as the photoresist composition.

Figure 14:
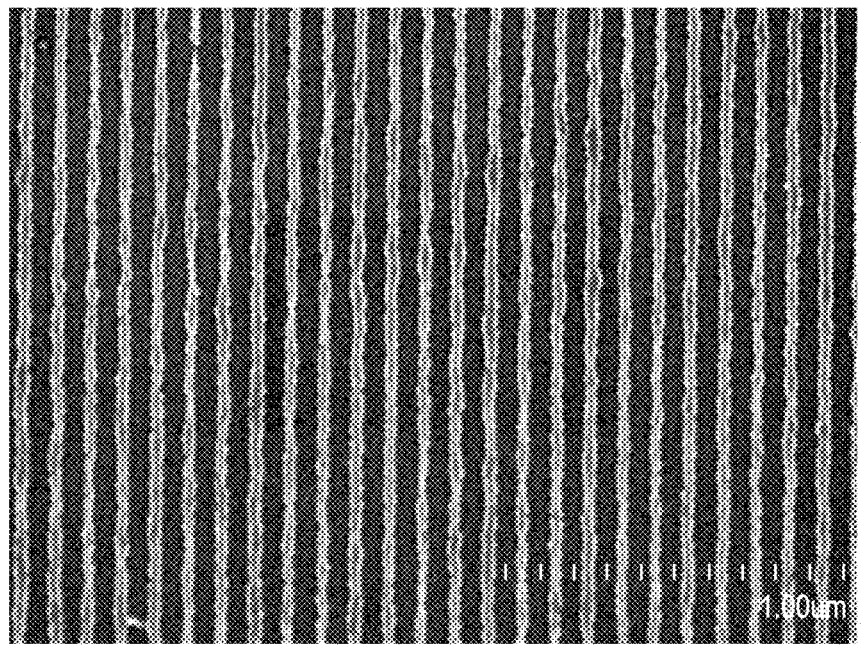
FIG. 14 is an SEM of the 50 nm half pitch line pattern obtained with the photoresist composition of Example 5 using interferometric lithography at 193 nm (4.0 mJ/cm$^2$) and the following process conditions: 300 sec PAB at 150° C., 60 sec PEB at 150° C., and 60 sec development in 0.26 N TMAH.

FIG. 14 is an SEM image of the 50 nm half pitch line pattern obtained with the photoresist composition of Example 5 using interferometric lithography at 193 nm (4.0 $mJ/cm^2$) and the following process conditions: 300 sec PAB at 150° C., 60 sec PEB at 150° C., 60 sec development in 0.26 N TMAH.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. When a range is used to express a possible value using two numerical limits X and Y (e.g., a concentration of X ppm to Y ppm), unless otherwise stated the value can be X, Y, or any number between X and Y.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and their practical application, and to enable others of ordinary skill in the art to understand the invention.

What is claimed is:

1. A photoresist composition, comprising:
   water;
   about 0.1 wt % to about 30 wt % hydrogen peroxide; and
   about 1 wt % to about 30 wt % of a peroxo complex having a structure according to formula (1):

   $$[C']_k[M'_w(O_2)_x(L')_yO_u] \qquad (1),$$

wherein
   w is 1 or 2,
   x is an integer of 1 to 4,
   y is an integer of 1 to 4,
   u is 0 or 1,
   $M'_w(O_2)_x(L')_yO_u$ has a charge of 0 to −3,
   C' is ammonium ($NH_4^+$),
   k is an integer of 0 to 3,
   M' is a metal ion selected from the group consisting of Tantalum (V), Niobium (V), Titanium (IV), and combinations thereof, and
   L' is an oxidatively stable organic carboxylate ligand;
   wherein
   wt % (weight percent) is based on total weight of the photoresist composition, and
   the photoresist composition is suitable for forming a photoresist layer in a process for e-beam lithography, x-ray lithography, and/or lithography utilizing an ultraviolet radiation source having a wavelength in the range of 400 nm to 10 nm, wherein the process includes imagewise exposing the photoresist layer to produce an exposed photoresist layer comprising i) exposed photoresist consisting essentially of exposed peroxo complex and ii) non-exposed photoresist consisting essentially of non-exposed peroxo complex, and removing the non-exposed photoresist using water or aqueous base developer to form a patterned photoresist layer comprising the exposed photoresist.

2. The photoresist composition of claim 1, wherein u is 0 and w is 1.

3. The photoresist composition of claim 2, wherein M' is Tantalum (V).

4. The photoresist composition of claim 1, wherein the peroxo complex is selected from the group consisting of
   $[NH_4]_4[Ta_2(O_2)_2(C_3H_4O_3)_4O]$ wherein $C_3H_4O_3$ is lactate $(C_3H_4O_3^{-2})$,
   $[NH_4]_4[Ta_2(O_2)_2(C_2H_2O_3)_4O]$ wherein $C_2H_2O_3$ is glycolate $(C_2H_2O_3^{-2})$, $[NH_4]_4[Nb_2(O_2)_2(C_3H_4O_3)_4O]$ wherein $C_3H_4O_3$ is lactate $(C_3H_4O_3^{-2})$, $[NH_4]_3[Ta(O_2)_3(C_2O_4)]$ wherein $C_2O_4$ is oxalate $(C_2O_4^{-2})$, $[NH_4]_2[Ti(O_2)_2(C_2O_4)]$ wherein $C_2O_4$ is oxalate $(C_2O_4^{-2})$, and combinations thereof.

5. A method, comprising:
   i) providing a photoresist composition comprising:
      water;
      about 0.1 wt % to about 30 wt % hydrogen peroxide, and
      about 1 wt % to about 30 wt % of a peroxo complex having a structure according to formula (1):

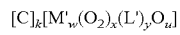 (1), wherein
      w is 1 or 2,
      x is an integer of 1 to 4,
      y is an integer of 1 to 4,
      u is 0 or 1,
      $M'_w(O_2)_x(L')_yO_u$ has a charge of 0 to −3,
      C' is ammonium $(NH_4^+)$,
      k is an integer of 0 to 3,
      M' is a metal ion selected from the group consisting of tantalum (V), niobium (V), titanium (IV), and combinations thereof,
      L' is an oxidatively stable organic carboxylate ligand, and
      wt % is based on total weight of the photoresist composition;
   ii) disposing the photoresist composition on a surface of a substrate and removing the solvent, thereby forming a photoresist layer disposed on the substrate;
   iii) imagewise exposing the photoresist layer to radiation selected from the group consisting of e-beam, x-ray, and ultraviolet (UV) radiation, thereby producing an exposed photoresist layer comprising i) exposed photoresist consisting essentially of exposed peroxo complex and ii) non-exposed photoresist consisting essentially of non-exposed peroxo complex; and
   iv) removing the non-exposed photoresist by developing the exposed photoresist layer with water and/or aqueous base, thereby forming a layered structure comprising a patterned photoresist layer disposed on the substrate, the patterned photoresist layer comprising topographical features comprising the exposed photoresist.

6. The method of claim 5, wherein the photoresist layer is exposed imagewise using an ultraviolet radiation source at a wavelength that is in the range of 400 nm to 10 nm.

7. The method of claim 5, wherein the photoresist layer is exposed imagewise using an ultraviolet radiation source at a wavelength of 13.5 nm.

8. The method of claim 5, wherein the method further comprises baking the disposed photoresist layer before said exposing.

9. The method of claim 5, wherein the method further comprises baking the disposed photoresist layer before said developing.

10. The method of claim 5, wherein the method further comprises transferring the pattern of features of the patterned photoresist layer to the substrate.

11. The method of claim 10, wherein the method further comprises baking the patterned photoresist layer before transferring features of the patterned photoresist layer to the substrate.

12. A photoresist composition, comprising:
    a halide or alkoxide salt of a metal ion selected from the group consisting of titanium (IV), Niobium (V) and Tantalum (V);
    an oxidatively stable organic carboxylic acid in an amount of 0.5 to 3.0 molar equivalents relative to moles of the metal ion;
    hydrogen peroxide in an amount of 1.0 to 10.0 molar equivalents relative to moles of the metal ion;
    ammonium hydroxide; and
    water;
    wherein
       the photoresist composition is suitable for forming a photoresist layer comprising a peroxo complex of the metal ion in a process for e-beam lithography, x-ray lithography, and/or lithography utilizing an ultraviolet radiation source having a wavelength that is in the range of 400 nm to 10 nm, wherein the process includes imagewise exposing the photoresist layer to form an exposed photoresist layer comprising i) exposed photoresist consisting essentially of exposed peroxo complex and ii) non-exposed photoresist consisting essentially of non-exposed peroxo complex, and removing the non-exposed photoresist using water or aqueous base developer to form a patterned photoresist layer comprising the exposed photoresist.

13. The photoresist composition of claim 12, wherein the organic carboxylic acid is present in an amount of 0.75 to 1.5 molar equivalents relative to moles of the metal ion.

14. The photoresist composition of claim 12, wherein the organic carboxylic acid is present in an amount of 0.9 to 1.1 molar equivalents relative to moles of the metal ion.

* * * * *